United States Patent [19]
Ha et al.

[11] Patent Number: 5,767,446
[45] Date of Patent: Jun. 16, 1998

[54] PRINTED CIRCUIT BOARD HAVING EPOXY BARRIER AROUND A THROUGHOUT SLOT AND BALL GRID ARRAY SEMICONDUCTOR PACKAGE

[75] Inventors: Sun Ho Ha; Young Wook Heo, both of Kyungki-Do, Rep. of Korea

[73] Assignees: Anam Industrial Co., Ltd., Seoul, Rep. of Korea; Amkor Electronics, Inc., Chandler, Ariz.

[21] Appl. No.: 736,107

[22] Filed: Oct. 24, 1996

[30] Foreign Application Priority Data

Oct. 27, 1995 [KR] Rep. of Korea ............... 95-37513

[51] Int. Cl.⁶ ............................................. H01L 23/02
[52] U.S. Cl. .......................... 174/52.4; 174/260; 361/768
[58] Field of Search ........................... 174/52.4, 52.2, 174/260; 361/743, 760, 761, 763, 764, 772, 773, 774, 777, 778, 779, 768; 257/787, 779, 713, 692

[56] References Cited

U.S. PATENT DOCUMENTS 5,120,678  6/1992  Moore et al. ..................... 437/183
5,266,748  11/1993  Kawakami et al. .............. 174/262
5,612,576  3/1997  Wilson et al. .................... 257/788

Primary Examiner—Kristine L. Kincaid
Assistant Examiner—Kristina Soderquist
Attorney, Agent, or Firm—Skjerven, Morrill, MacPherson, Franklin & Friel LLP; Thomas S. Macdonald

[57] ABSTRACT

A printed circuit board (PCB) having an epoxy barrier disposed around its throughout slot in a semiconductor chip mounting region, and a BGA semiconductor package using such a PCB, thereby exhibiting a high moisture discharge characteristic. The epoxy barrier includes a copper layer and a solder resist layer both disposed around the throughout slot and is defined by a groove which is disposed around the throughout slot while spacing apart from the periphery of the throughout slot by a desired distance. Alternatively, the epoxy barrier includes a solder resist layer formed to a desired width around the throughout slot on the uppermost layer laminated on the PCB. By virtue of the epoxy barrier, the throughout slot is not closed by epoxy resin coated over the PCB. As a result, it is possible to externally discharge moisture which expands in the PCB upon carrying out a series of processes for the fabrication of the package at a high temperature or mounting the package on a mother board. Accordingly, it is possible to eliminate interface peeling-off and formation of cracks. This results in an improvement in reliance of final products.

10 Claims, 2 Drawing Sheets

PRINTED CIRCUIT BOARD HAVING EPOXY BARRIER AROUND A THROUGHOUT SLOT AND BALL GRID ARRAY SEMICONDUCTOR PACKAGE

BACKGROUND OF THE INVENTION

1. Field of the Invention

The present invention relates to printed circuit boards (PCB) provided with epoxy barriers and ball grid array (BGA) semiconductor packages using such PCB's. More particularly, the present invention relates to a PCB having an epoxy barrier disposed around its throughout slot in a semiconductor chip mounting region, and a BGA semiconductor package using such a PCB, thereby exhibiting a high moisture discharge characteristic.

2. Description of the Prior Art

BGA semiconductor packages are well known which have a structure including a PCB, at least one semiconductor chip mounted on the upper surface of the PCB and an array of solder balls arranged on the surface of the PCB opposite to the surface to which the semiconductor chip is attached. The solder ball array serves to provide an electrical connection for the PCB.

Typically, such BGA semiconductor packages are fabricated as follows. Thermally conductive resin such as silver-contained epoxy is first coated over a PCB, and then a semiconductor chip is attached to the PCB. Thereafter, the epoxy is baked. Wire bonding is then carried out in order to electrically connect bond pads provided on the semiconductor chip to electrically conductive traces formed on the upper surface of the PCB. The resulting structure is then molded with a resin sealant so as to form a seal for protecting the semiconductor chip and bonding wires from environments. Subsequently, an infrared ray reflowing process is conducted to fuse solder balls to the lower surface of the PCB. The infrared ray reflowing process is achieved in a furnace using infrared rays as a heat source while supplying heated air or nitrogen gas into the furnace. Finally, a trimming process is conducted for the resulting structure.

In the above fabrication procedure, however, the PCB attached with the semiconductor chip are repeatedly subjected to thermal stress as it passes through several essential processes, including a wire bonding process and a molding process, which are conducted at a high temperature of, for example, 150° C. or more. Such thermal stress increases due to the difference in thermal expansion coefficient between the PCB and semiconductor chip. A stress concentration phenomenon may occur at the interface between the semiconductor chip and PCB which is the weakest area. Such a stress concentration phenomenon results in a local peeling-off. In severe cases, a pop corn phenomenon occurs. That is, the peeled-off layer portion becomes undone, and cracks are generated at peripheral areas. Since such a pop corn phenomenon results in an abrupt degradation in quality of final products, it is impossible to ensure the reliance of products. Furthermore, when a BGA semiconductor package fabricated in the above-mentioned manner is mounted on a mother board, moisture existing in the package expands because the mounting process is conducted at a high temperature of 220° C. or more. Due to such moisture expansion, peeling-off and crack formation may occur at the interface between the semiconductor chip and PCB which is the weakest area. As a result, there is a degradation in reliance of the package.

In order to solve the above-mentioned problems, various schemes have been proposed. One scheme is illustrated in FIGS. 3A and 3B. In the illustrated case, a vertical throughout slot 26' is provided in a PCB 20' on which a semiconductor chip 30' is mounted. The vertical throughout slot 26' serves to externally discharge moisture which expands upon carrying out a series of processes for the fabrication of the package 10' at a high temperature, testing the reliance of the package 10' or mounting the package 10' on a mother board, so as to eliminate interface peeling-off and formation of cracks.

In this case, however, it is difficult to precisely control the dispensing amount and thickness of epoxy resin upon forming an epoxy resin layer 70' adapted to bond the semiconductor chip 40' to the PCB 20'. This is because the upper end of the throughout slot 26' formed in the PCB 20' is flush with the surface of the solder resist layer 22' laminated over the copper layer 21' which is formed on the PCB 20'. As a result, it is difficult to fabricate an epoxy dispenser with a high efficiency. Moreover, the epoxy resin may enter the throughout slot 26' through the upper end opening flush with the solder resist layer 22' when the semiconductor chip 40' is depressed against the epoxy resin dispensed on the PCB 20' for its attachment, as shown in FIG. 3A. In this case, the throughout slot 26' may be blocked by the surplus epoxy resin portion 71 introduced therein. As a result, it is difficult to externally discharge moisture from the package. Where the surplus epoxy resin 71 introduced in the throughout slot 26' flows downwardly to the lower surface of the PCB 20' because of its excessive amount, there is an additional problem in that the epoxy resin may contaminate the lower surface of the package 10' and the device as used for the attachment of the semiconductor chip 40'. The blocking of the throughout hole 26' by the surplus epoxy resin 71 results in an abrupt degradation in moisture discharge efficiency, thereby reducing the life span of the package 10'. There is also a high possibility of interface peeling-off and formation of cracks degrading the reliance of final products.

SUMMARY OF THE INVENTION

Therefore, an object of the invention is to solve the above-mentioned problems and to provide a PCB having at least one epoxy barrier disposed around its throughout slot in a region where a semiconductor chip is mounted, thereby effectively preventing epoxy resin as used to bond the semiconductor chip from entering the throughout slot.

Another object of the invention is to provide a BGA semiconductor package using such a PCB, thereby exhibiting a high moisture discharge characteristic to eliminate interface peeling-off and formation of cracks.

In accordance with one aspect, the present invention provides a printed circuit board having at least one vertical throughout slot provided in a selected portion of a chip mounting pad of the substrate on which a semiconductor chip is mounted, the throughout slot serving to externally discharge moisture from the substrate; wherein the improvement comprises an epoxy barrier disposed on the substrate around the throughout slot and adapted to prevent an epoxy resin as used to bond the semiconductor chip to the substrate from entering the throughout slot.

In accordance with another aspect, the present invention provides a ball grid array semiconductor package comprising: a semiconductor chip; a printed circuit board mounting the semiconductor chip thereon, the printed circuit board being provided with at least one vertical throughout slot at its portion on which the semiconductor chip is mounted, and an epoxy barrier disposed around the throughout slot; wires adapted to electrically connect bond pads of the semiconductor chip to electrically conductive traces formed on the printed circuit board; a seal molded on the printed circuit board by a sealant and adapted to protect the semiconductor chip and wires from environments; and a plurality of solder balls fused to the surface of the printed circuit board opposite to the surface on which the semiconductor chip is mounted, the solder balls serving as input/output terminals; whereby the package has a high moisture discharge characteristic.

BRIEF DESCRIPTION OF THE DRAWINGS

Other objects and aspects of the invention will become apparent from the following description of embodiments with reference to th accompanying drawings in which.

DETAILED DESCRIPTION OF THE PREFERRED EMBODIMENTS

Figure 1A:
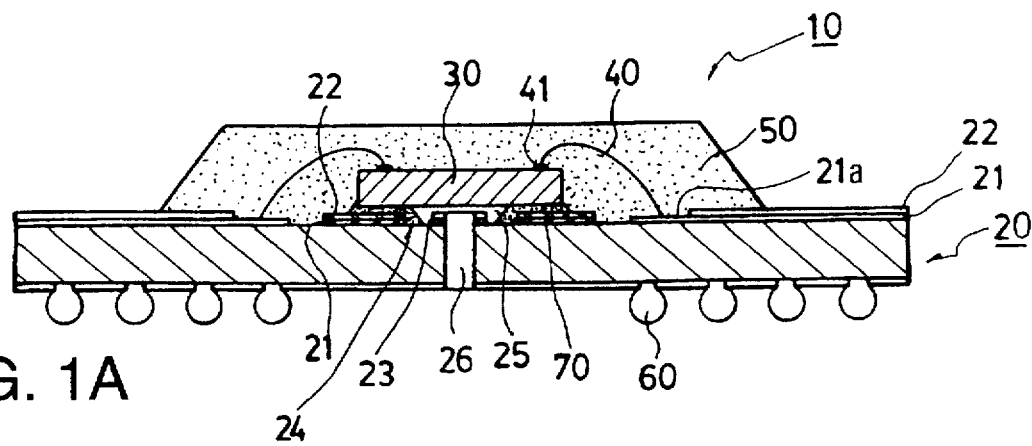
FIGS. 1A and 1B are sectional views respectively illustrating a BGA semiconductor package fabricated by use of a PCB having a structure according to an embodiment of the present invention.
Figure 1B:
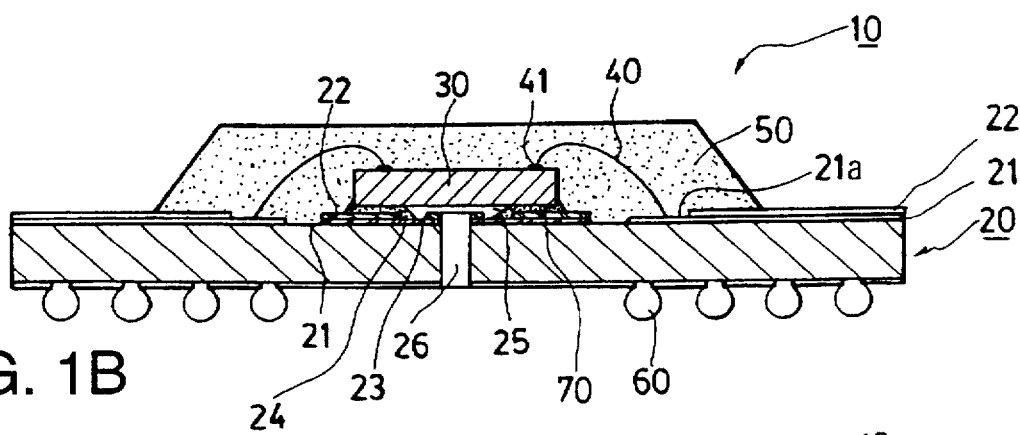

FIGS. 1A and 1B are sectional views respectively illustrating a BGA semiconductor package fabricated by use of a PCB having a structure according to an embodiment of the present invention.

As shown in FIGS. 1A and 1B, the package, which is denoted by the reference numeral 10, includes a PCB 20 and a semiconductor chip 30 mounted on the PCB 20. Wires 40 are provided to electrically connect bond pads 41 of the semiconductor chip 30 to electrically conductive traces 21a formed on the upper surface of the PCB 20. The package also includes a molded seal 50 for protecting the semiconductor chip 30 and wires 40 from environments, and a plurality of solder balls 60 used as input/output terminals.

Preferably, the PCB 20 may be made of bismaleimide triazine.

In accordance with the illustrated embodiment, the PCB 20 is provided with a copper layer 21 and a solder resist layer 22 which are sequentially laminated over a chip mounting pad of the PCB 20. The solder resist layer 22 is not covered on a portion of the copper layer 21 forming the conductive traces 21a where the wires 40 are bonded. At least one throughout slot 26 is formed in the PCB 20 in a region where the semiconductor chip 30 is mounted. The throughout slot 26 serves to externally discharge moisture from the package. The PCB 20 is also provided with an epoxy barrier 23 around the throughout slot 26 so as to prevent epoxy resin 70 used for the attachment of the semiconductor chip 30 from flowing into the throughout slot 26.

In accordance with the embodiment of FIGS. 1A and 1B, the epoxy barrier 23 consists of the copper layer 21 and solder resist layer 22 laminated on a chip mounting pad of the PCB 20. The epoxy barrier 23 is defined by a groove 24 disposed around the throughout slot 26 while spaced apart from the periphery of the throughout slot 26 by a desired distance. In the case of FIG. 1A, the groove 24 is formed by removing respective portions of the copper layer 21 and solder resist layer 22 disposed around the throughout slot 26 while spaced apart from the periphery of the throughout slot 26 by a desired distance. The removal of the copper layer 21 and solder resist layer 22 is carried out in such a manner that the groove 24 has a vertical or inclined side wall surface. Alternatively, the groove 24 may be formed by removing only a desired portion of the solder resist layer 22, as shown in FIG. 1B. Although the solder resist layer 22 is shown as consisting of a single layer, it may consist of two layers. In this case, one or both of the solder resist layers may be removed to form the groove 24. Thus, the epoxy barrier 23 is provided which is disposed around the throughout slot 26.

The width of the epoxy barrier 23 and the width of the groove 24 may be optionally selected in accordance with a variety of parameters including physical properties, such as viscosity, of the epoxy resin 70 and processing conditions as used.

Figure 2:
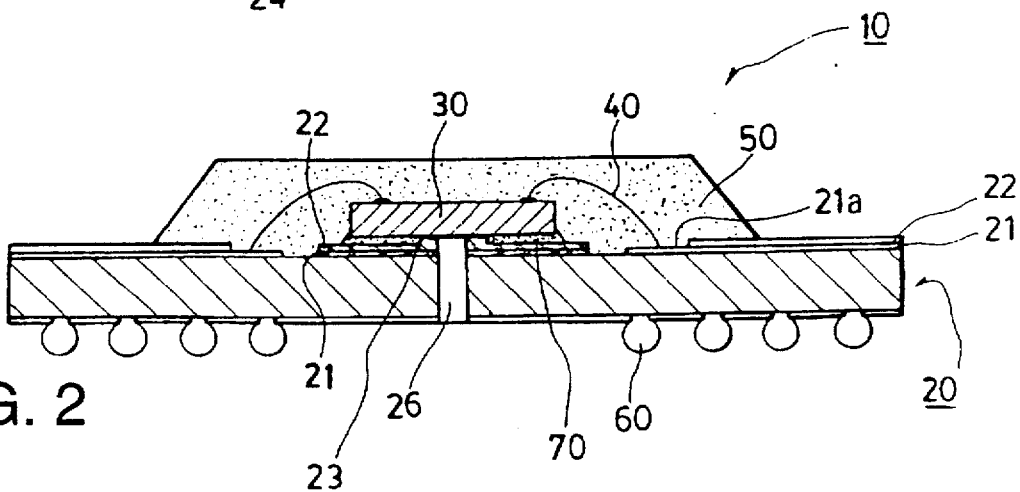
FIG. 2 is a sectional view illustrating a BGA semiconductor package fabricated by use of a PCB having a structure according to another embodiment of the present invention.

FIG. 2 is a sectional view illustrating a BGA semiconductor package fabricated by use of a PCB having a structure according to another embodiment of the present invention. This package has the same basic structure as that of the above-mentioned embodiment. In FIG. 2, elements respectively corresponding to those in FIGS. 1A and 1B are denoted by the same reference numerals.

In accordance with the embodiment of FIG. 2, the epoxy barrier 23 consists of an additional solder resist layer formed around the throughout slot 26 on the solder resist layer 22 which is the uppermost layer laminated on the PCB 20. The epoxy barrier 23 has a structure upwardly protruded from the PCB 20. The epoxy barrier 23 has an upper surface extending in parallel to the upper surface of the PCB 20 so that it can match with the semiconductor chip 30.

The protruded epoxy barrier 23 has a vertical or inclined side wall. The width of the epoxy barrier 23 may be optionally selected in accordance with a variety of parameters including physical properties, such as viscosity, of the epoxy resin 70 and processing conditions as used.

In either case of FIGS. 1A and 1B or FIG. 2, the epoxy barrier 23 may have an optional planar shape such as circular, rectangular, square or oval shape.

In accordance with either embodiment, the epoxy resin 70 is dispensed onto the PCB 20 on the outside of the epoxy barrier 23 in order to bond the semiconductor chip 30 to the PCB 20. As the semiconductor chip 30 is depressed on the epoxy resin 70, the epoxy resin 70 flows laterally, so that it can be uniformly distributed. At this time, the epoxy resin 70 does not enter the throughout slot 26 by virtue of the epoxy barrier 23. Accordingly, it is possible to eliminate interface peeling-off and formation of cracks resulting from the blocking of the throughout slot 26 by the epoxy resin 70.

Since the upper surface of the throughout slot 26 protrudes from the area surrounding the throughout slot 26, it is possible to relatively precisely control the dispensing amount and thickness of the epoxy resin 70. Accordingly, an improvement in reliance of the package 10 is achieved.

Figure 3A:
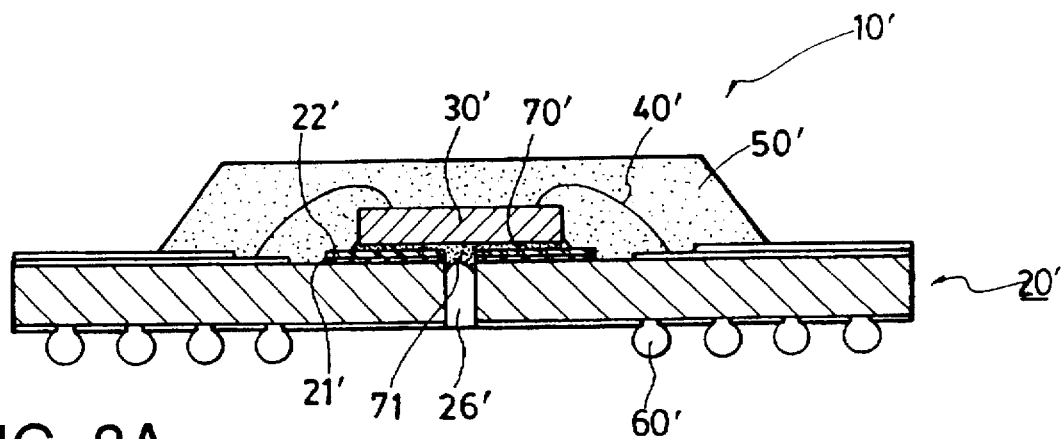
FIGS. 3A and 3B are sectional views respectively illustrating a BGA semiconductor using a conventional PCB in which a degradation in quality has occurred upon mounting a semiconductor chip.
Figure 3B:
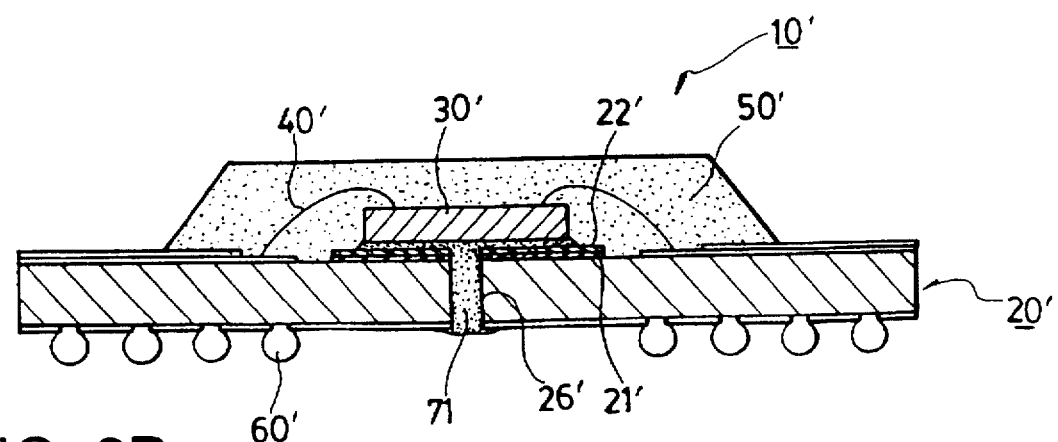

In order to evaluate the packages respectively having the structures of FIGS. 1A, 1B and 2 according to the present invention, a test was conducted which checks whether the epoxy resin as used has entered the throughout hole and whether interface peeling-off and formation of cracks have occurred. For comparison, the conventional package of FIG. 3A was also tested. The checking about the interface peeling-off and formation of cracks was conducted after each sample was maintained under severe conditions including a temperature of 85° C. and relative humidity of 60% for 168 hours. The results of the test are described in the following table:

TABLE

|  | Slot Blocking | Peeling-off/Crack |
| --- | --- | --- |
| Package of FIG. 1A | 0/15 | 0/15 |
| Package of FIG. 1B | 0/15 | 0/15 |
| Package of FIG. 2 | 0/15 | 0/15 |
| Conventional Package | 7/15 | 3/15 |

The test results described in the table were obtained for 15 samples. The value described in each item of the table is indicative of the rate of packages having a poor quality, namely, the ratio of the number of poor samples to the total number of samples.

Referring to the table, it can be found that all the packages fabricated in accordance with the present invention have a good quality in that the interface peeling-off and formation of cracks did not occur in any of them.

As apparent from the above description, the present invention provides a BGA semiconductor package including a PCB provided with an epoxy barrier disposed around its throughout slot adapted to discharge moisture. By virtue of such an epoxy barrier, the throughout slot is not closed by epoxy resin coated over the PCB. As a result, it is possible to externally discharge moisture which expands in the PCB upon carrying out a series of processes for the fabrication of the package at a high temperature or mounting the package on a mother board. Accordingly, it is possible to eliminate interface peeling-off and formation of cracks. This results in an improvement in reliance of final products.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A printed circuit board including a substrate having at least one vertical throughout slot provided in a selected portion of the substrate on which a semiconductor chip is attached by an epoxy resin, the throughout slot serving to externally discharge moisture from the substrate; wherein the improvement comprises:

an epoxy barrier disposed on the substrate around and above the throughout slot and in the selected portion of the substrate such that the barrier does not obstruct the throughout slot and the epoxy resin as used to attach the semiconductor chip to the substrate is prevented from entering the throughout slot by the barrier.

2. A printed circuit board including a substrate having at least one vertical throughout slot provided in a selected portion of the substrate on which a semiconductor chip is mounted, the throughout slot serving to externally discharge moisture from the substrate; wherein the improvement comprises:

an epoxy barrier disposed on the substrate around the throughout slot and adapted to prevent an epoxy resin as used to bond the semiconductor chip to the substrate from entering the throughout slot; and wherein the epoxy barrier comprises portions of a copper layer and a solder resist layer disposed around the throughout slot and is defined by a groove which is disposed around the throughout slot and spaced apart from the periphery of the throughout slot by a desired distance.

3. The printed circuit board in accordance with claim 2, wherein the groove is formed by removing other portions of the copper layer and the solder resist layer disposed around the throughout slot.

4. The printed circuit board in accordance with claim 2, wherein the groove is formed by removing another portion of the solder resist layer disposed around the throughout slot.

5. The printed circuit board in accordance with claim 2, wherein the epoxy barrier consists of an additional solder resist layer formed to a desired width around the throughout slot on the solder resist layer disposed on the substrate.

6. A ball grid array semiconductor package comprising:

a semiconductor chip;

a printed circuit board having a first surface mounting the semiconductor chip thereon, the printed circuit board being provided with at least one vertical throughout slot at a portion of the printed circuit board on which the semiconductor chip is mounted by an epoxy resin, and an epoxy barrier disposed in said portion around the throughout slot such that the barrier does not obstruct the throughout slot and prevents the epoxy resin from entering the throughout slot;

wires adapted to electrically connect bond pads of the semiconductor chip to electrically conductive traces formed on the printed circuit board;

a molded seal on the printed circuit board formed by a sealant and adapted to protect the semiconductor chip and the wires from environments;

a plurality of solder balls fused to a second surface of the printed circuit board opposite to the first surface on which the semiconductor chip is mounted, the solder balls serving as input/output terminals; and whereby the package has a high moisture discharge characteristic.

7. A ball grid array semiconductor package comprising:

a semiconductor chip;

a printed circuit board mounting the semiconductor chip thereon, the printed circuit board being provided with at least one vertical throughout slot at a portion on which the semiconductor chip is mounted, and an epoxy barrier disposed around the throughout slot;

wires adapted to electrically connect bond pads of the semiconductor chip to electrically conductive traces formed on the printed circuit board;

a seal molded on the printed circuit board by a sealant and adapted to protect the semiconductor chip and the wires from environments; and a plurality of solder balls fused to a surface of the printed circuit board opposite to the surface on which the semiconductor chip is mounted, the solder balls serving as input/output terminals; and wherein the epoxy barrier consists of a copper layer and a solder resist layer both disposed around the throughout slot and is defined by a groove which is disposed around the throughout slot and spaced apart from the periphery of the throughout slot by a desired distance;

whereby the package has a high moisture discharge characteristic.

8. The ball grid array semiconductor package in accordance with claim 7, wherein the groove is formed by removing a portion of the copper layer and the solder resist layer disposed around the throughout slot.

9. The ball grid array semiconductor package in accordance with claim 7, wherein the groove is formed by removing a portion of the solder resist layer disposed around the throughout slot.

10. The ball grid array semiconductor package in accordance with claim 6, wherein the epoxy barrier consists of a solder resist layer formed to a desired width around the throughout slot on an uppermost layer laminated on the printed circuit board.

* * * * *